United States Patent [19]

Pham et al.

[11] 4,394,589
[45] Jul. 19, 1983

[54] LOGIC CIRCUIT INCLUDING AT LEAST ONE RESISTOR OR ONE TRANSISTOR HAVING A SATURABLE RESISTOR FIELD EFFECT TRANSISTOR STRUCTURE

[75] Inventors: Ngu T. Pham; Gérard Nuzillat, both of Paris, France

[73] Assignee: Thomson-CSF, Paris, France

[21] Appl. No.: 323,535

[22] Filed: Nov. 20, 1981

Related U.S. Application Data

[62] Division of Ser. No. 121,179, Feb. 13, 1980.

[51] Int. Cl.³ .......................................... H03K 19/094
[52] U.S. Cl. .................................... 307/450; 307/446; 357/22; 357/55
[58] Field of Search ............... 307/448, 450, 304, 446; 357/22, 55

[56] References Cited

U.S. PATENT DOCUMENTS 3,700,981  10/1972  Masuhara et al. .................. 307/450
4,028,556  6/1977  Cachier et al. ...................... 307/450
4,300,064  11/1981  Eden .................................... 307/450

*Primary Examiner*—John S. Heyman
*Attorney, Agent, or Firm*—Oblon, Fisher, Spivak, McClelland & Maier

[57] ABSTRACT

A logic circuit including an input stage, wherein a first field-effect transistor is in series with a first saturable resistor interposed on the drain side in the supply of the first transistor, and an output stage including a second transistor which is identical with the first and has a supply on the drain side which is common with the input stage supply. The gate of the second transistor is connected to the drain of the first transistor. The supply circuit of the second transistor is closed across a forward-biased diode, and a second saturable resistor on the ground of the common supply is connected to the source of the first transistor. At least a selected of the field effect transistors or the saturable resistors has a saturable resistor structure formed of a layer of semiconductor material on a semi-insulating substrate. The material is doped to set up a dipolar domain in respect of an electric field which is higher than a so-called critical value. The saturable resistor structure further includes a groove cut in the semiconductor layer between two ohmic contacts so as to define a residual channel in the material. The dimensions of the groove are such that the critical value of the electric field is overstepped in respect of a value of the order of one volt of the voltage between the ohmic contacts.

5 Claims, 16 Drawing Figures

FIG_1
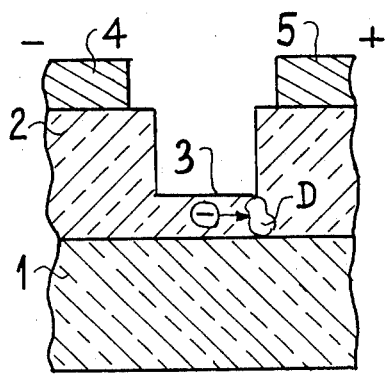
FIG_3
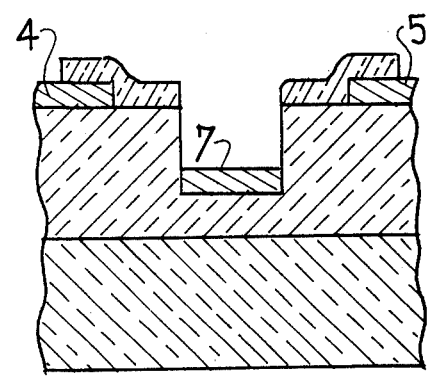
FIG_2
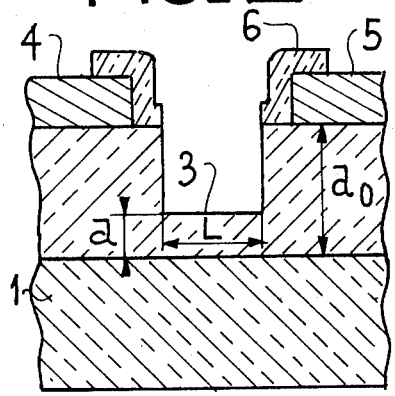
FIG_4
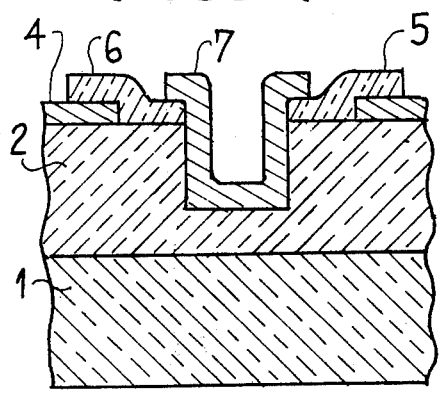
FIG_5
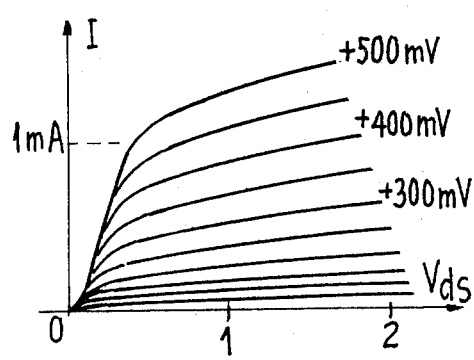
FIG_6
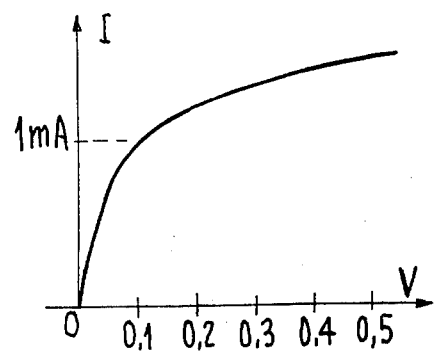

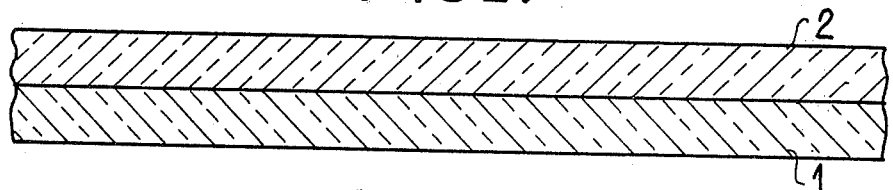
FIG_7
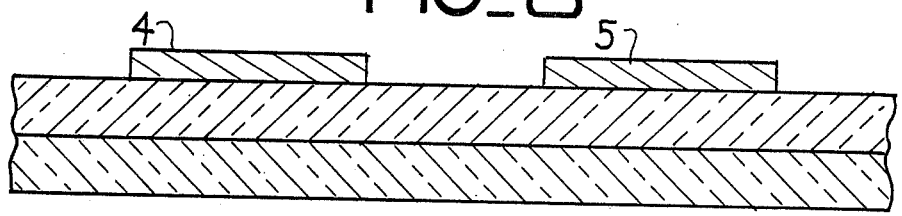
FIG_8
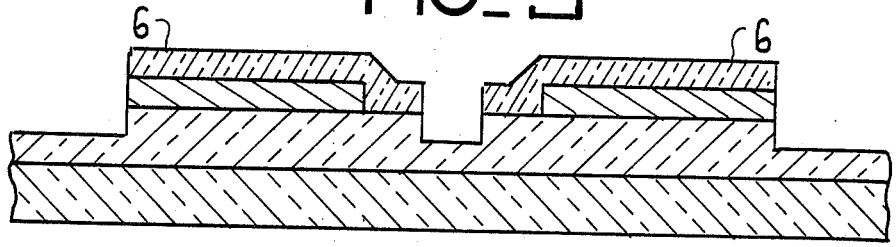
FIG_9
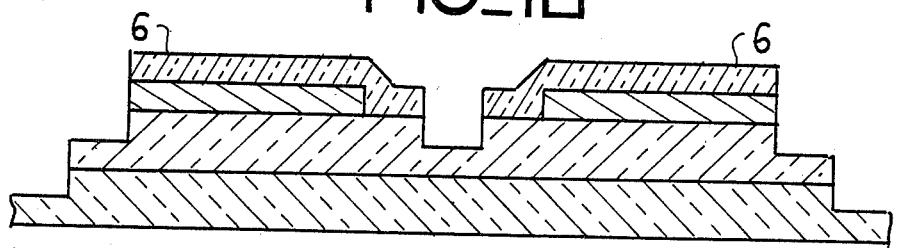
FIG_10
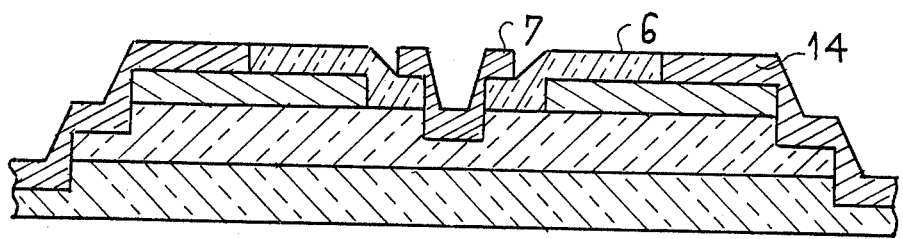
FIG_11

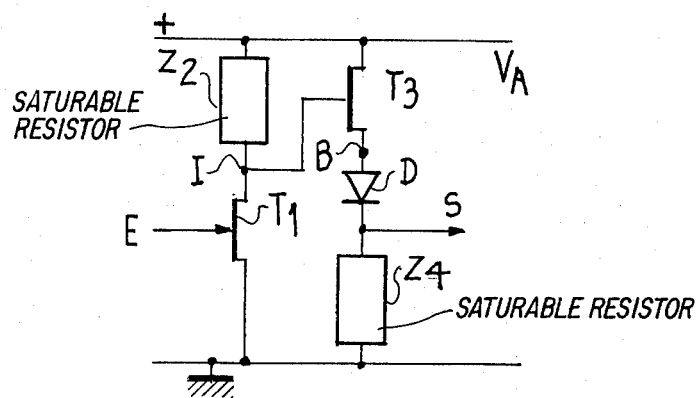
FIG_12
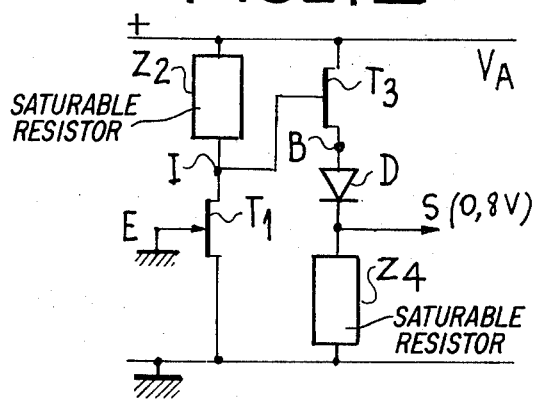
FIG_13
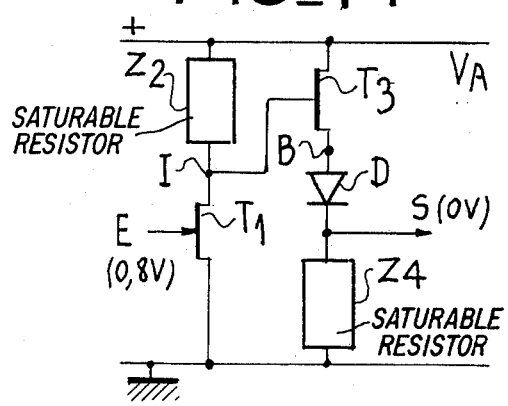
FIG_14
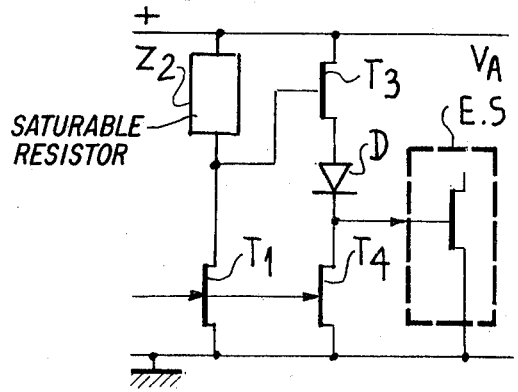
FIG_15
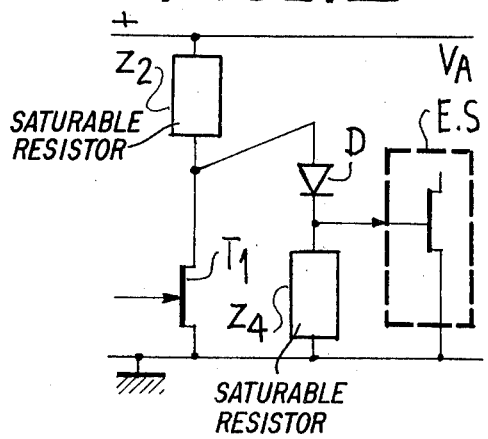
FIG_16

LOGIC CIRCUIT INCLUDING AT LEAST ONE RESISTOR OR ONE TRANSISTOR HAVING A SATURABLE RESISTOR FIELD EFFECT TRANSISTOR STRUCTURE

This is a division of application Ser. No. 121,179, filed Feb. 13, 1980.

This invention relates to a field-effect transistor of the "normally off" type (as defined below). The transistor structure can be employed as a saturable resistor when provision is not made for a control gate. Furthermore, this structure permits the construction of field-effect transistors and logic circuits which make use of at least one resistor or a transistor having said structure.

At the present time, all integrated circuits on GaAs (gallium arsenide) and fabricated from transistors either of the junction field-effect type (JFET) or of the Schottky gate type (MESFET).

Transistors are of two types: normally conducting transistors, in which the drain-source current is cut-off by pinching the normally existing channel (depletion transistors) by applying a suitable voltage; and the normally closed transistors, in which the channel is opened by applying a suitable gate voltage (enhancement transistors).

The first type of transistor suffers from the disadvantage of high power consumption. Moreover, the input voltage $V_{GS}$ (gate-source potential difference) and the output voltage $V_{DS}$ (drain-source potential difference) are of opposite polarity. In the case of an n-type channel, the cut-off voltage is negative whereas the supply voltage is positive. In consequence, provision has to be made for two supply sources.

In transistors of the second type, it is necessary to control the value of the threshold voltage or minimum turn-on voltage, and therefore of doping and of thickness of the active zone (in which the channel is formed). Fabrication is a very delicate process and results in a high proportion of production rejects.

The invention makes it possible to overcome the above-mentioned disadvantages by means of a structure wherein the channel comprises a notch or groove.

The structure according to the invention comprises a layer of semiconductor material on a semi-insulating substrate, the character and type of doping of said material being such as to set up a dipolar domain in respect of a given electric field, two ohmic contacts being formed on said layer.

The structure is primarily distinguished by the fact that a groove is cut in the semiconducting layer so as to delimit a residual channel in the material, the dimensions of said channel being such that the critical value of the electric field is overstepped in respect to a value of the order of one volt of the voltage between the ohmic contacts.

A more complete understanding of the invention will be obtained from the following description, reference being made to the accompanying drawings in which:

FIGS. 1 and 2 are sectional views showing two examples of resistors having a structure according to the invention;

FIGS. 3 and 4 show two examples of construction of field-effect transistors which make use of a structure according to the invention;

FIGS. 5 and 6 are explanatory diagrams;

FIGS. 7 to 11 show a structure according to the invention during the different fabrication steps;

FIG. 12 shows one example of a logic circuit which makes use of the structures according to the invention;

FIGS. 13 and 14 show the circuit of FIG. 12 in two logical states;

FIGS. 15 and 16 respectively are diagrams showing two other circuits.

In FIGS. 1 and 2, the reference numeral 1 designates a semi-insulating logical substrate of gallium arsenide (GaAs), the reference numeral 2 designates an epitaxial layer of the same material and doped by an impurity of n-type conductivity, and the reference numerals 4, 5 designates two ohmic contacts on said layer.

Between the contacts 4 and 5, a groove 3 having a bottom wall thickness a has been cut in the active layer having a thickness $a_o$. In FIG. 2, the complete assembly is partially covered by a layer 6 of silica which protects the edge of the ohmic contacts.

It has been discovered in the laboratories of the present Applicant that, under certain conditions which will be explained in detail hereinafter, the current between ohmic contacts rapidly attains a saturation value $I_S$ which is practically a constant in the case of a given material such as gallium arsenide, for example, and a given geometrical configuration having the following dimensions, for example:

a = depth of residual channel (of the order of 0.1μ)
L = length of channel (of the order of one micron)
Z = width of channel (of the order of 10 to 100μ)

The following empirical formula has been established:

$$I_S = \gamma(V_c)^2 Z \tag{1}$$

in which $\gamma$ is a characteristic coefficient of the material (40 microamperes per volt and per micron having a length Z in the case of gallium arsenide) and in which $V_c$ is defined as follows:

$V_c$ is the knee voltage of the saturation curve or in other words the voltage between ohmic contacts at which the current attains a value very close to the value at saturation.

As is the case with $I_S$, it is observed that $V_c$ is remarkably constant in respect of a given material and a given configuration is a collective fabrication of devices having the structure according to the invention.

The following breakdown of the voltage $V_c$ has been proposed:

$$V_c = V_X - V_T \tag{2}$$

where $V_X$ is the voltage between the edges of the groove when the field E attains the critical value $E_c$ in the case of said material. We have:

$$V_X = E_c L \tag{3}$$

Furthermore, $V_T$ is the threshold voltage or pinch-off voltage. In fact, in a field-effect transistor (even in a gateless structure as in the case of the structure according to the invention), a certain space charge exists in the groove, which explains the reason for transistors of the "normally off" type. It is this space charge which explains the introduction of the term $V_T$.

In the case of the orders of magnitude defined earlier in regard to the material and the configuration, said threshold voltage is as follows:

$$-0.5 \leq V_T \leq +0.2 \text{ volt}$$

Example of calculation in the case of $I_S$:
when:
$a = 0.1\mu$
$L = 1\mu$
$Z = 20\mu$
we have in the case of n-doped gallium arsenide at $10^{17}$ at/cm$^3$:
$V_X = 3300$ V/cm $\times 10^{-4}$ cm $= 0.33$ volt
$V_T = -0.2$ volt
$V_c = 0.53$ volt
$I_S = 40 \, (0.53)^2 \cdot 20 = 224$ microamperes.

A noteworthy feature is the low value of this saturation current which is particularly advantageous when very low power consumption is a desirable objective. Fabrication of this structure is wholly possible by making use of the ionic machining process.

The sectional views of FIGS. 3 and 4 show respectively a field-effect transistor and a Schottky gate transistor which utilize the structure according to the invention. The same references designate the same elements as in the previous figures. The terminals 4 and 5 are respectively the source and the drain of said transistors. A metallic deposit 7 constitutes the transistor gate.

FIGS. 5 and 6 are examples of characteristic curves representing the current I and the voltage V in the case of the elements shown in FIGS. 1 and 2 and the families of characteristic curves $I = f(V_{ds})$ represent different voltages applied to the gate in the case of the element of FIGS. 3 and 4.

FIG. 7 and following show the steps involved in the fabrication of saturable resistors and transistors which have just been described.

In FIG. 7 the n-type doped active layer 2 having an impurity density of $10^{17}$ at/cm$^3$ and a thickness of 2500 angstroms is formed on the insulating substrate 1 by epitaxial growth.

In FIG. 8, any suitable means (such as electronic masking and the like) are employed in order to deposit the two ohmic contacts 4 and 5 (terminals of a resistor, source and drain of a transistor).

In FIG. 9, a silica mask 6 has been formed in order to define the groove which serves as a channel in order to protect the surface of the transistors or the resistor terminals in the spaces formed between these latter and the channel; this masking operation has made it possible to form the channel 7 by means of a conventional method of chemical etching.

In FIG. 10, a "mesa" etch has been performed at 10 and 11, for example through an aluminum mask which covers the entire surface of the transistors; the residual aluminum was removed after machining by selective chemical attack.

In FIG. 11, machining of the grooves has been performed. The ionic machining process was employed in order to obtain vertical sides. The erosion energy is fairly low (100 KeV to 500 KeV). The depth of the groove can be controlled by measuring the current between the ohmic contacts at constant voltage.

Finally, if it is desired to obtain a field-effect transistor, deposition of a Schottky gate 7 is performed within the groove by successive depositions of titanium, platinum and gold.

The following figures illustrate logic circuits which make use of structures according to the invention.

The advantage of some types of field-effect inverters comprising enhancement-mold transistors lies in the fact that, since the transistors are normally "off", they are turned-on only by applying to the gate voltages having the same polarity as the supply voltage.

Such inverters are nevertheless attended by a disadvantage in that they are difficult to construct since the parameters of the active layer have to be controlled with extremely high precision. Furthermore, the use of source and gate transistors interconnected as saturable resistors is incompatible with this type of transistor.

In the case of the invention, the saturable resistors and the groove-type channel enhancement transistors can be fabricated simultaneously. In addition, the threshold voltage $V_T$ of the field-effect transistors can be controlled during fabrication as has been noted earlier.

There is shown in FIG. 12 a logic inverter in which the logic input E is connected to the gate of a transistor $T_1$, the source of which is connected to ground, the drain of which is connected to a node I, said node being in turn connected to the supply source $V_A$ through a saturable resistor $Z_2$.

The transistor $T_1$ is preferably of the type shown in either FIG. 3 or FIG. 4, and the saturable resistor is of the type shown in FIGS. 1 and 2.

The node I is connected to the gate of a transistor $T_3$ which is identical with $T_1$. The drain of said transistor $T_3$ is connected to the supply line $V_A$ whilst its source B has a diode D which conducts from $V_A$ to ground, the other terminal of said diode D being connected to ground through a resistor $Z_4$ of the same type as the resistor $Z_2$.

By way of example, the channel width Z (or length of the groove) is 40 $\mu$m in the case of the structures of $T_1$, $T_3$ and $Z_4$ and 20 $\mu$m in the structure of $Z_2$. In general terms, the width of the structure of $Z_2$ must be smaller than that of the transistor $T_1$. Moreover, an optimum logic circuit is obtained when the structures of $T_1$, $T_3$ and $Z_4$ have the same channel width.

The operation of the structure according to the invention will become apparent from the following figures.

In the first place, emphasis should be laid on the fact that an important parameter of the field-effect transistors herein described is that of the residual voltage $V_{residual}$ which is the residual drain-source voltage when the transistor is in the conducting state.

In circuits of known type, the input transistor of a logic circuit can be cut-off only if $V_T \geq V_{residual}$.

These circuits can therefore be constructed in practice only with distinctly positive thresholds of the order of 0.2 V, namely between 150 and 200 mV. In the circuits which will be described hereinafter, this condition no longer exists.

In FIG. 13, the input E is connected to ground in the state "0", the transistor $T_1$ is cut-off, the potential at the node I is in the vicinity of $V_A$, the gate-source junction of the transistor $T_3$ is forward-biased, the potential at the node B (source of the transistor $T_3$) tends to rise to $V_A$. The potential at the output S cannot rise above 0.8 V since it is connected to the input gate of the following stage (which is identical with that of FIG. 13) and since the voltage drop at the terminals of the gate-source junction of the transistor $T_1$ (which is in the conducting state in this case) is of the order of 0.8 V.

The voltage $V\delta$ across the terminals of the diode D which is in the conducting state is also of the order of 0.8 V. The output current is limited by the resistor $Z_2$.

In FIG. 14, the gate of the transistor $T_1$ is brought to level "1" (substantially 0.8 V) which is limited by the forward bias of the gate-source junction.

By definition, the potential at the node I is the $V_{residual}$ voltage of the transistor $T_1$ which is in the conducting state.

This tends to turn-off the transistor $T_3$; the current throughout the assembly $T_3$—D—$Z_4$ will remain of very low value.

The output S is bridge-connected between the diode D and the resistor $Z_4$. In point of fact, the resistor $Z_4$ has a very low value and the resistance of the diode in respect of a very low potential in the forward direction applied between its terminals is distinctly higher. The diode consequently handles the entire residual potential between B and ground; the output S is therefore clamped to ground.

By reason of the highly non-linear characteristic of the diode in the vicinity of its knee voltage, only a very low current is required within the assembly $T_3$—D—$Z_4$ for this effect to take place.

The result thereby achieved is that, in the inverter under consideration, the condition $V_T$ which is very close to 0 but essentially positive is no longer necessary and that it will prove sufficient to maintain the inequality $V_T \geq V_{residual} - V\delta_o$, where $V\delta_o$ is the value of the knee voltage of the diode D. $V_T$ could even be negative since the knee voltage of the diode is in the vicinity of 0.5 V. $V_T$ could be higher than $-0.3$ V rather than $V_{residual}$.

In the case of several diodes in series (two diodes, for example), the results achieved would be such that $V_T > -0.8$ V.

To sum up, although the diode D is always forward-biased, it is essentially the presence of said diode which makes it possible to increase the range of threshold voltages towards low and even negative values and which clamps the output at the bottom level; the residual voltage of the transistors is no longer a determining factor.

There is shown in FIG. 15 an alternative embodiment of the logic circuit of FIG. 12 in which a transistor $T_4$ has been substituted for the transistor $Z_4$ and in which the transistor gate is connected in parallel with the gate of transistor $T_1$ whilst the remainder of the circuit remains unchanged. This circuit arrangement has the following advantages:

When the transistor $T_4$ is turned-off (stage "0" at the input), the current within said transistor is lower than in the resistor $Z_4$ of the previous figures. In this state, however, the potential drop takes place essentially within the diode D.

By way of example, the performances measured on a ring oscillator constituted by eleven inverters of the type shown in FIG. 15 are as follows:

| | | |
|---|---|---|
| $V_A = 1.4$ V | $t_{pd} = 300$ ps | $p = 360$ μW |
| $V_A = 2.4$ V | $t_{pd} = 110$ ps | $p = 2$ mW |
| $V_A = 3.4$ V | $t_{pd} = 95$ ps | $p = 4.5$ mW | in respect of;

$N = 1.5 \times 10^{17}$ cm$^{-3}$; $L = 1$ μm; $X_{SD} = 3$ μm where N is the doping of the active zone, L is the channel length (FIG. 2), $X_{SD}$ is the source-drain distance of each component.

Furthermore, we have:

$Z(T_1) = Z(Z_2) = Z(T_4) = 35$ μm $Z(T_3) = Z(D) = 40$ μm where Z is the width of each element (shown between brackets).

Another alternative embodiment is shown in FIG. 16. Compared with the circuit arrangement of FIG. 12, the transistor $T_3$ has been dispensed with, thus resulting in higher integration desnity. The condition to be satisfied in regard to the different currents is as follows:

$$I(Z_2) > I_{DSS}(T_1) + I(Z_4)$$
$$I(Z_2) \quad I_{max}(T_1) + I(Z_4) \text{ where}$$

where $I_{DSS}(T_1)$ is the saturation current of $T_1$ at $V_{GS} = 0$ (zero in the case of an enhancement-mode MESFET) and $I_{MAX}(T_1)$ is the maximum current of transistor $T_1$ in the case of the input in the high state, and $I(Z_1)$ is the current within resistor $T_4$.

This circuit arrangement has the disadvantage of power consumption in both states.

What is claimed is:

1. A logic circuit comprising an input stage, wherein a first field-effect transistor is in series with a first saturable resistor interposed on the drain side in the supply of the first transistor, an output stage including a second transistor which is identical with the first and has a supply on the drain side which is common with the input stage supply, the gate of the second transistor being connected to the drain of the first transistor, the supply circuit of the second transistor being closed across a forward-biased diode, and a second saturable resistor on the ground of the common supply is connected to the source of the first transistor, an input terminal connected to the gate of the first transistor and an output terinal tapped between the diode and the second saturable resistor;

wherein at least a selected one of the field effect transistors or the saturable resistors has a saturable resistor structure comprising a layer of semiconductor material on a semi-insulating substrate, the character and type of doping of said material being such as to set up a dipolar domain in respect of an electric field which is higher than a so-called critical value, and further comprising two ohmic contacts on said layer, wherein a groove is cut in the semiconductor layer between the ohmic contacts so as to define a residual channel in the material, the dimensions of said groove being such that the critical value of the electric field is overstepped in respect of a value of the order of one volt of the voltage between said ohmic contacts.

2. A logic circuit comprising a first leg wherein a first field-effect transistor is in series with a first saturable resistor interposed on the drain side in the supply of the first tranistor, a second leg comprising a second field-effect transistor in which the supply on the drain side is common with the supply of said first circuit leg, the gate of the second transistor being connected to the drain of the first transistor, the supply circuit of the second transistor being closed across a forward-biased diode and a third transistor which is identical with the first on the ground on the common supply connected to the source of the first transistor, an input terminal connected to a terminal which is common to the gates of the first and third transistors, and an output terminal connected between the diode and the third transistor;

wherein at least a selected one of said field effect transistors or said saturable resistors has a saturable resistor structure comprising a layer of semiconductor material on a semi-insulating substrate, the character and type of doping of said material being such as to set up a dipolar domain in respect of an electric field which is higher than a so-called critical value, and further comprising two ohmic contacts on said layer, wherein a groove is cut in the semiconductor layer between the ohmic contacts so as to define a residual channel in the material, the dimensions of said groove being such that the critical value of the electric field is overstepped in respect of a value of the order of one volt of the voltage between said ohmic contacts.

3. A circuit comprising a saturable resistor between a first and a second pole of a direct-current supply battery, said resistor being connected in series with a double circuit leg in which the first leg comprises a field-effect transistor and the second leg comprises a forward-biased diode in series with a saturable resistor, an input connected to the gate of the first transistor and an output connected between the diode and the saturable resistor;

wherein at least a selected one of said field effect transistors or said saturable resistors has a saturable resistor structure comprising a layer of semiconductor material on a semi-insulating substrate, the character and type of doping of said material being such as to set up a dipolar domain in respect of an electric field which is higher than a so-called critical value, and further comprising two ohmic contacts on said layer, wherein a groove is cut in the semiconductor layer between the ohmic contacts so as to define a residual channel in the material, the dimensions of said groove being such that the critical value of the electric field is overstepped in respect of a value of the order of one volt of the voltage between said ohmic contacts.

4. A saturable resistor according to claims 1, 2 or 3, wherein the semiconductor material is gallium arsenide.

5. A saturable resistor according to claim 4, wherein the active layer is n-type.

* * * * *

UNITED STATES PATENT AND TRADEMARK OFFICE
CERTIFICATE OF CORRECTION

PATENT NO. : 4,394,589

DATED : July 19, 1983

INVENTOR(S) : Pham, Ngu T. et al

It is certified that error appears in the above-identified patent and that said Letters Patent is hereby corrected as shown below:

On The Title Page Insert;

-- [30] Foreign Application Priority Data

February 13, 1979 France......79 03639 --.

Signed and Sealed this

Sixth Day of December 1983

[SEAL]

Attest:

GERALD J. MOSSINGHOFF

Attesting Officer

Commissioner of Patents and Trademarks